(12) United States Patent
Rao et al.

(10) Patent No.: US 11,657,861 B2
(45) Date of Patent: May 23, 2023

(54) METHOD AND SYSTEM FOR ASYNCHRONOUS MULTI-PLANE INDEPENDENT (AMPI) MEMORY READ OPERATION

(71) Applicant: Yangtze Memory Technologies Co., Ltd., Wuhan (CN)

(72) Inventors: Yi Rao, Wuhan (CN); Zhuqin Duan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/214,150

(22) Filed: Mar. 26, 2021

(65) Prior Publication Data
US 2022/0238145 A1    Jul. 28, 2022

Related U.S. Application Data

(63) Continuation of application No. PCT/CN2021/073925, filed on Jan. 27, 2021.

(51) Int. Cl.
*G11C 7/22* (2006.01)
*G11C 7/10* (2006.01)

(52) U.S. Cl.
CPC .............. *G11C 7/22* (2013.01); *G11C 7/1036* (2013.01); *G11C 7/1051* (2013.01); *G11C 7/1078* (2013.01)

(58) Field of Classification Search
CPC ....... G11C 7/22; G11C 7/1036; G11C 7/1051; G11C 7/1078
See application file for complete search history.

(56) References Cited

U.S. PATENT DOCUMENTS

| 10,445,019 B2 * | 10/2019 | Yun ....................... G06F 3/0673 |
| 2015/0006794 A1 * | 1/2015 | Kang .................... G06F 3/0659 |
| | | 711/103 |
| 2016/0011779 A1 * | 1/2016 | Lee ....................... G06F 3/0688 |
| | | 711/103 |

(Continued)

OTHER PUBLICATIONS

The World Intellectual Property Organization (WIPO) International Search Report for PCT/CN2021/073925 dated Nov. 8, 2021 4 pages.

*Primary Examiner* — Vanthu T Nguyen
(74) *Attorney, Agent, or Firm* — Anova Law Group, PLLC (57) ABSTRACT

A flash memory device includes a plurality of memory planes each contains arrays of memory cells; a host interface for accessing the plurality of memory planes by an external host; and a controller connected to the plurality of memory planes via a memory interface and controlling the host interface for accessing the plurality of memory planes. The controller is configured to perform: receiving one or more commands on the host interface from the external host; determining whether to perform asynchronous multi-plane independent (AMPI) read operation corresponding to the commands; and after determining to start the AMPI read operation, accessing the memory planes in parallel according to the commands, and completing the AMPI read operation using an order of the commands determined based on an indicator signal provided to the controller to correspond to a sequence of the commands received on the host interface.

18 Claims, 8 Drawing Sheets

(56) References Cited

U.S. PATENT DOCUMENTS

| | | | |
|---|---|---|---|
| 2019/0107945 A1 | 4/2019 | Chun et al. | |
| 2019/0206494 A1 | 7/2019 | Han et al. | |
| 2019/0227719 A1* | 7/2019 | Park | G06F 3/061 |
| 2021/0048960 A1* | 2/2021 | Son | G06F 3/0673 |
| 2021/0200443 A1* | 7/2021 | Park | G06F 3/0613 |

* cited by examiner

METHOD AND SYSTEM FOR ASYNCHRONOUS MULTI-PLANE INDEPENDENT (AMPI) MEMORY READ OPERATION

RELATED APPLICATION

This application is a continuation application of PCT Patent Application No. PCT/CN2021/073925, filed on Jan. 27, 2021, content of which is incorporated by reference in its entirety.

FIELD OF THE TECHNOLOGY

This application relates to the field of semiconductor technology and, specifically, to a method and system for asynchronous multi-plane independent (AMPI) read operation for flash memory chips.

BACKGROUND

Semiconductor memory devices have become more and more popular for use in various electronic devices. For example, non-volatile semiconductor memory is used in cellular telephones, digital cameras, personal digital assistants, mobile computing devices, non-mobile computing devices and other devices. The amount of data used by these devices is also increasing rapidly, which drives higher flash memory volumes and pushes faster speeds. To keep up with market demands, NAND flash technology is rapidly evolving, and a NAND flash chip is often packaged with multiple NAND dies at the package level to increase the capacity of the NAND flash chip. Various ways to increase the speed of access to the NAND flash chip are being developed.

SUMMARY

In one aspect of the present disclosure, a flash memory device is provided. The flash memory device includes a plurality of memory planes each contains arrays of memory cells; a host interface for accessing the plurality of memory planes by an external host; and a controller connected to the plurality of memory planes via a memory interface and controlling the host interface for accessing the plurality of memory planes. The controller is configured to perform: receiving one or more commands on the host interface from the external host; determining whether to perform asynchronous multi-plane independent (AMPI) read operation corresponding to the commands; and after determining to start the AMPI read operation, accessing the memory planes in parallel according to the commands, and completing the AMPI read operation using an order of the commands determined based on an indicator signal provided to the controller to correspond to a sequence of the commands received on the host interface.

According to an embodiment of the present disclosure, the controller is further configured to perform: when determining not to start the AMPI read operation, processing the commands in series as normal operation.

According to an embodiment of the present disclosure, the controller includes: a plurality of shift registers, wherein each shift register corresponds to one of the memory planes and has a length of a predetermined number of bits, and a non-zero bit of the shift register selectively indicates whether a command is pending for a corresponding memory plane and/or a non-corresponding memory plane; a signal generation circuit coupled to the plurality of shift registers and receiving outputs from the plurality of shift registers to generate the indicator signal; and a processing microcontroller configured to receive the indicator signal and to control the shift registers and the signal generation circuit, wherein the indicator signal is a multi-bit asynchronous plane signal, each bit of the indicator signal corresponds to one of the memory planes, and a non-zero bit in the indicator signal indicating the command for a corresponding memory plane is to be completed.

According to an embodiment of the present disclosure, the processing microcontroller determines to start the AMPI read operation when the commands are for separate memory planes.

According to an embodiment of the present disclosure, the shift registers are initially reset to a first data state, when a command is received from the external host, a shift register is set to a second data state when it is determined that the command is for the memory plane corresponding to the shift register, and the shift register is left shift by 1 bit when it is determined that the command is a memory plane not corresponding to the shift register.

According to an embodiment of the present disclosure, the signal generation circuit combines one bit from each of the outputs of the shift registers to form the indicator signal for that bit, starting from the most significant bit (MSB) to the least significant bit (LSB), so as to set the order of the commands.

According to an embodiment of the present disclosure, the signal generation circuit includes a plurality of selectors connected to the outputs of corresponding shift registers, each selector is individually controlled to output either the output of the corresponding shift register or 0 to form the indicator signal.

According to an embodiment of the present disclosure, the length of the predetermined number of bits of the shift registers indicates a maximum number of pending commands that can be processed for the AMPI read operation.

According to an embodiment of the present disclosure, the length of the predetermined number of bits of the shift registers is 4.

According to an embodiment of the present disclosure, a total number of the memory planes is 4; a total number of the shift registers is 4; and the indicator signal is a 4-bit signal.

According to an embodiment of the present disclosure, the host interface is an open NAND flash interface (ONFI).

In another aspect of the present disclosure, a method is provided for a flash memory device. The flash memory device includes a plurality of memory planes each contains arrays of memory cells, a host interface for accessing the plurality of memory planes by an external host, and a controller connected to the plurality of memory planes via a memory interface and controlling the host interface for accessing the plurality of memory planes. The method includes receiving one or more commands on the host interface from the external host; determining whether to perform asynchronous multi-plane independent (AMPI) read operation corresponding to the commands; and after determining to start the AMPI read operation, accessing the memory planes in parallel according to the commands, and completing the AMPI read operation using an order of the commands determined based on an indicator signal provided to the controller to correspond to a sequence of the commands received on the host interface.

According to an embodiment of the present disclosure, the method further includes: when determining not to start the AMPI read operation, processing the commands in series as normal operation.

According to an embodiment of the present disclosure, wherein the controller includes a plurality of shift registers, each shift register corresponding to one of the memory planes, a signal generation circuit coupled to the plurality of shift registers, and a processing microcontroller configured to control the shift registers and the signal generation circuit. The method further includes: using a non-zero bit of the shift register to selectively indicate whether a command is pending for a corresponding memory plane and/or a non-corresponding memory plane; receiving outputs from the plurality of shift registers to generate the indicator signal, wherein the indicator signal is a multi-bit asynchronous plane signal, and each bit of the indicator signal corresponds to one of the memory planes; and receiving the indicator signal and using a non-zero bit in the indicator signal to indicate the command for a corresponding memory plane is to be completed.

According to an embodiment of the present disclosure, the method further includes: when the commands are for separate memory planes, determining to start the AMPI read operation.

According to an embodiment of the present disclosure, the method further includes: initially setting a shift registers to a first data state, and after a command is received from the external host, setting the shift register to a second data state when it is determined that the command is for the memory plane corresponding to the shift register, and left shifting the shift register by 1 bit when it is determined that the command is a memory plane not corresponding to the shift register.

According to an embodiment of the present disclosure, the method further includes: combining, by the signal generation circuit, one bit from each of the outputs of the shift registers to form the indicator signal for that bit, starting from the most significant bit (MSB) to the least significant bit (LSB), so as to set the order of the commands, wherein the signal generation circuit includes a plurality of selectors connected to the outputs of corresponding shift registers, each selector is individually controlled to output either the output of the corresponding shift register or 0 to form the indicator signal.

According to an embodiment of the present disclosure, a length of a predetermined number of bits of the shift registers indicate a maximum number of pending commands that can be processed for the AMPI read operation.

According to an embodiment of the present disclosure, the length of the predetermined number of bits of the shift registers is 4.

According to an embodiment of the present disclosure, a total number of the memory planes is 4; a total number of the shift registers is 4; the indicator signal is a 4-bit signal; and the host interface is an open NAND flash interface (ONFI).

Other aspects of the present disclosure can be understood by those skilled in the art in light of the description, the claims, and the drawings of the present disclosure.

DETAILED DESCRIPTION

The following describes the technical solutions in the embodiments of the present disclosure with reference to the accompanying drawings. Wherever possible, the same reference numbers will be used throughout the drawings to refer to the same or like parts. Apparently, the described embodiments are merely some but not all of the embodiments of the present disclosure. Features in various embodiments may be exchanged and/or combined. Other embodiments obtained by a person skilled in the art based on the embodiments of the present disclosure without creative efforts shall fall within the scope of the present disclosure.

A controller is often packaged in a flash chip together with multiple NAND dies to provide input/output functions of the NAND dies, and each NAND die can include multiple planes of memory cells. To achieve high data rates, the multiple planes of the NAND die(s) have to be able to accept and process read commands in parallel, without any address or timing restriction. Further, internally, such parallel read operation cannot cause prolonged bus operation or occur mis-sequenced read results on the data bus.

Figure 1:
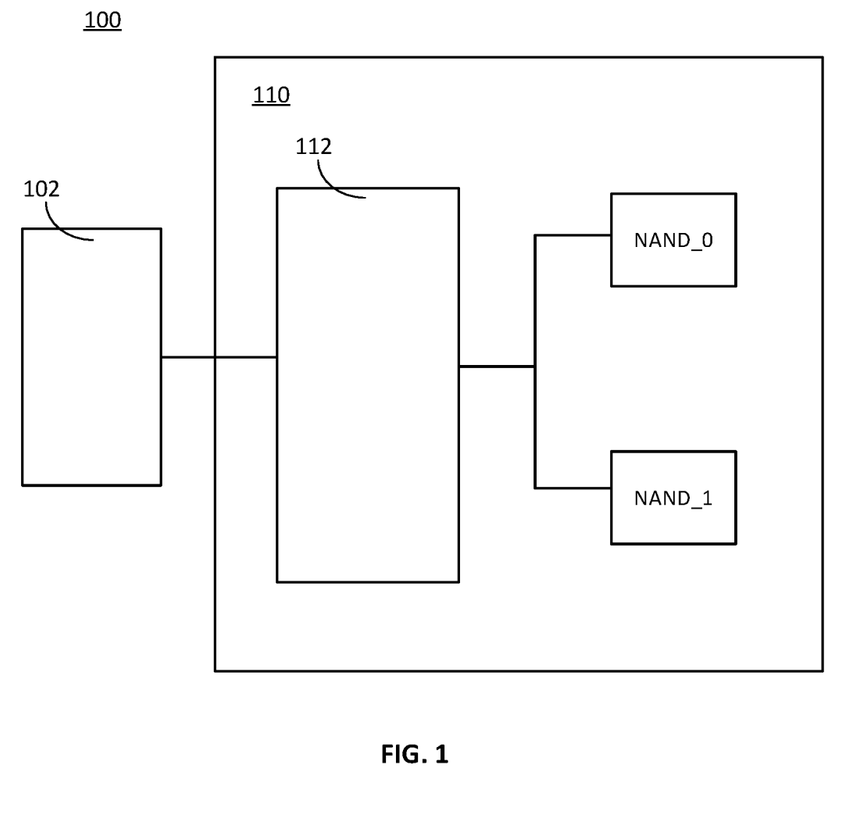
FIG. 1 illustrates an operating environment incorporating certain embodiments of the present disclosure.

FIG. 1 illustrates an operating environment incorporating certain embodiments of the present disclosure. As shown in FIG. 1, operating environment 100 (e.g., a storage system) includes a host device 102 and a flash memory device 110. Other devices may also be included.

The host device 102 may include any host processor or host controller configured to interact with the flash memory device, such as a CPU, GPU (general processing unit), ASIC (application-specific integrated circuit), microcontroller, etc. The host device 102 may be connected with and communicate the flash memory device 110 via one or more communication paths such as one or more buses. The flash memory device 110 may include any flash memory storage devices that stores data in a persistent manner for the host device 102, such as a flash memory chip packaged in various ways. In certain embodiments, such flash memory chip may be a NAND flash chip. Although NAND flash memory is used as an example, other type of flash memory may also be used. The flash memory device 110 may include a controller 112 and a plurality of NAND dies (e.g., NAND_0, NAND_1). Any number of NAND dies may be used, and other devices may also be included.

Each NAND die may be a separate NAND die or module, and the plurality of NAND dies may be separate NAND dies packaged together to form a flash memory chip. The controller 112 may be provided together with the plurality of NAND dies to support various interfaces of the flash memory device 110, such as an input interface, output interface, and/or control interface. For example, both the controller 112 and the plurality of NAND dies may reside in a common package, and the controller 112 may provide other external devices with interfaces to access the NAND dies, such as the host device 102.

Alternatively, the controller 112 and the plurality of NAND dies may reside in separate packages. For example, the controller 130 may reside in a controller package, while the NAND dies may reside in one or more flash packages. In certain embodiments, the NAND dies may be mounted on a printed circuit board with no packaging at all, or the NAND dies may be stacked together with or without packaging. Other configurations may also be used.

Furthermore, multiple communication paths such as buses can be provided between the controller 112 and control circuitry on each NAND die, including a NAND interface bus or any appropriate type of memory interface. The controller 112 may provide input/output control of the NAND dies. For example, when the host device 102 accesses the flash memory device 110, the controller 112 may facilitate the access to the NAND dies in the flash memory device 110, such as read and/or write data.

A NAND die may include arrays of memory cells. The data stored in a memory cell can be read in a read operation. For example, in a read operation, one or more control gate voltages are applied to a set of memory cells connected to a selected word line while sense circuits determines whether the cells are in a conductive or non-conductive state. The threshold voltage of a cell can therefore be determined and associated with a particular data state.

The memory cells may be arranged in blocks, and a block is the smallest unit of memory cells which can be concurrently erased. At a high structural level, the memory cells can be stored in different planes, each plane comprises a number of blocks of memory cells and associated row and column control circuitry. The memory cells in each plane may be arranged in a 2D or 3D memory structure.

The controller 112 may access (e.g., read, write, control, etc.) the NAND dies through a NAND interface, which may support a NAND interface protocol supporting reading, writing, and erasing functionalities of the memory blocks in the NAND dies.

Figure 2:
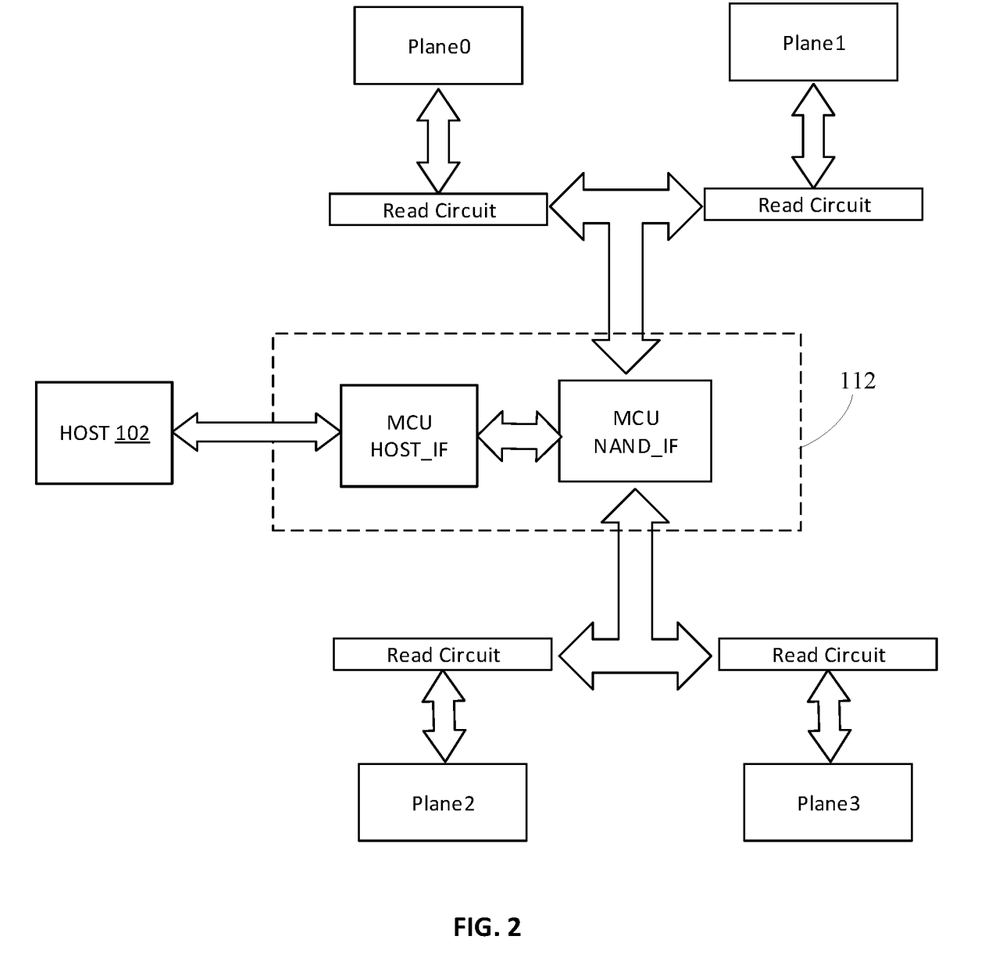
FIG. 2 illustrates a structure diagram of AMPI read operation configuration between the controller and the NAND memory planes consistent with the disclosed embodiments of the present disclosure.

Further, with the controller 112, the host device 102 may access the flash memory device 110 via a host interface, which may be a flash memory interface, such as an Open NAND Flash Interface (ONFI). The host interface may include a bus interface having certain control signal lines, clock signal lines, and data signal lines, etc. For example, the host device 102 may read from the flash memory device 110 at a certain address, and the address and data may be presented on the address/data bus signal lines of the host interface. To support fast read operation, the controller 112 may be configured to support asynchronous multi-plane independent (AMPI) read operations. FIG. 2 illustrates a structure diagram of AMPI read operation configuration between the controller and the NAND memory planes consistent with the disclosed embodiments of the present disclosure.

As shown in FIG. 2, a total four memory planes are used as an example to describe the AMPI read operation structure, and the controller 112 includes a microcontroller (MCU) NAND interface to interface with the four memory planes (MCU NAND_IF). In certain embodiments, the MCU NAND interface may include multiple channels and each channel may support four or other number of planes, such as two, eight, sixteen, etc. The four memory planes (plane0, plane1, plane2, and plane3) may be in one NAND die. In certain embodiments, the memory planes may be in two or more separate NAND dies.

According to the present disclosure, for read operation, the four planes are able to accept and process read commands in parallel without any address or timing restriction. For example, the read commands may be directed to any address, e.g., different addresses for different planes; the read commands may also be received at any time without any particular time sequence. The controller 112 may implement an array of processing cores (i.e., core microcontroller or core MCU), and each core MCU controls a corresponding memory plane. Further, four independent read circuits are implemented, and each read circuit is associated with one memory plane (e.g., plane0, plane1, plane2, and plane3) for independent read operation. Each core MCU is implemented to operate independently, and the controller 112 may include a memory processing microcontroller (or simply referred as the microcontroller, the MP MCU, or the controller 112) shared among all four cores to control the core MCUs, such as to enable/disable each core MCU.

The microcontroller may have four states: (1) a setup state: this state is, after a first AMPI command, to set up read parameters; (2) a config state: this state is to configure and enable a corresponding core MCU to start sensing read; (3) a polling state: this state is to wait for a next AMPI command; and (4) an end state: this state is, after a last AMPI command, to reset read circuits.

As shown in FIG. 2, the controller 112 also includes an MCU host interface to interface with the host 102 (MCU HOST_IF). During an AMPI read, because multiple planes can process the read operation independently, the host 102 may send multiple commands in a sequence. The controller 112 may receive the multiple commands from the bus interface with the host 102 and may cache or latch the received commands first and then send the commands to corresponding memory planes. The individual memory planes receive the commands (e.g., read, config, etc.) independently and return results back to the controller 112. For example, for read operation, the read address is set to a selected plane on the NAND interface, and data is sensed for data from the selected plane.

However, during the cached AMPI read, because the time taken from individual memory planes to process corresponding read operation may be different, there is a possibility that multiple read commands are ready to be processed by MP MCU at same time. That is, it may be possible that a later-received command is processed earlier than an earlier-received command, which is not expected by the host 102. Thus, in certain embodiments, the controller may include an AMPI logic to indicate which command comes first and which order it should use to process the commands received and cached. That is, the AMPI logic is used to ensure that all received commands are processed, with respect to the host 102, based on the input order of the commands or the order in which the commands are received from the host 102. In other words, the host 102 can see that the commands being processed and/or returned in the order it issues.

Figure 3:
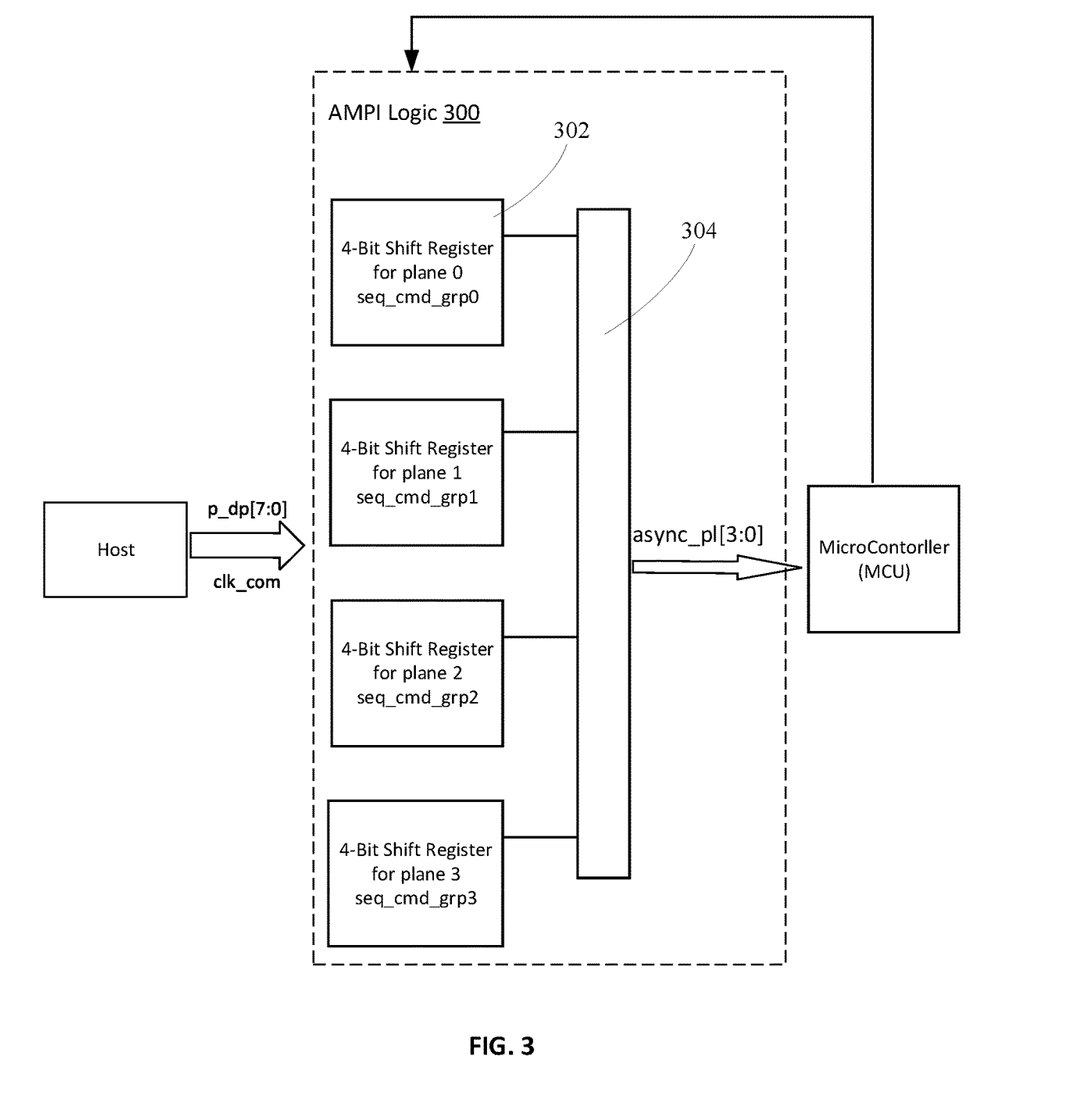
FIG. 3 illustrates a structure diagram of the AMPI logic implemented in the controller consistent with the disclosed embodiments of the present disclosure.

FIG. 3 illustrates a structure diagram of the AMPI logic implemented in the controller consistent with the disclosed embodiments of the present disclosure. As shown in FIG. 3, AMPI logic 300 may include four shift registers, seq_cmd_grp0, seq_cmd_grp1, seq_cmd_grp2, and seq_cmd_grp3, and a signal generation circuit 304. Other structures may also be included.

The number of the shift registers may be the same as the number of memory planes, each of the shift register corresponds to a memory plane. For example, for the shift registers seq_cmd_grp[3:0], the shift register seq_cmd_grp0 corresponds to plane0, the shift register seq_cmd_grp1 corresponds to plane1, the shift register seq_cmd_grp2 corresponds to plane2, and the shift register seq_cmd_grp3 corresponds to plane3. Other numbers of shift registers and memory planes may also be used.

Each shift register may have a length of a predetermined number of bits, and the length of the predetermined number of bits corresponds to a maximum number of pending commands to be processed, that is, a total of four pending commands can be processed in parallel at the same time. In certain embodiments, each shift register may be a 4-bit shift register, which in this case, is also the number of memory planes but it not necessarily the case. However, other number of bits may also be used for the shift register, if more buffers or cache may be used to latch and process pending commands at the same time.

When the host 102 starts the read operation, the host 102 may send a sequence of commands on the host interface or host bus interface (e.g., address/data signals p_dp[7:0], clock signal clk_com, etc.). The controller 112 may receive the commands from the host interface and cache or latch the commands. The controller 112 (e.g., the MP MCU) may latch command to each plane by setting each corresponding shift register to '0001'.

That is, if a command is for a particular plane, the shift register for the particular plane is set to '0001' to latch the command for the particular plane. While the command is being processed by the particular plane, the MP MCU sets a cache-read busy signal to indicate that the particular plane is busy, such that the host command cannot be sent to that plane until the particular plane completes the current operation, and the MP MCU sets the cache-read busy signal to indicate that the particular plane is ready to receive next command. For example, the MP MCU may set cache_rbn=0 to indicate the particular plane is busy, and sets cache_rbn=1 to indicate that the particular plane is ready. A total four cache-read busy signals cache_rbn[3:0] may be provided, each corresponding to a read circuit for a memory plane.

Further, after the MP MCU finishes processing the command for the particular plane, the MP MCU may clear the shift register for the particular memory plane. For example, the MP MCU may send a reset pulse to clear the seq_cmd_grp register of the particular plane.

The read operation can be a normal read operation or an AMPI read operation. For a normal read operation, the commands may simply be processed in series. For an AMPI read operation, the read operation can be performed in parallel among the separate and independent memory planes, and the results of the AMPI read operation are presented on the host interface in the order in which the commands are received by the controller. That is, the AMPI read operation is completed on the host interface in the receiving order, while the commands can be processed in parallel by the independent planes at the same time.

During the AMPI read operation, other commands may come in while one or more planes are still processing the current command(s). The MP MCU may determine if any coming in command is for a plane that is not currently processing commands. If so, the MP MCU may shift left by 1 bit of any current plane's shift register seq_cmd_grp.

Figure 4:
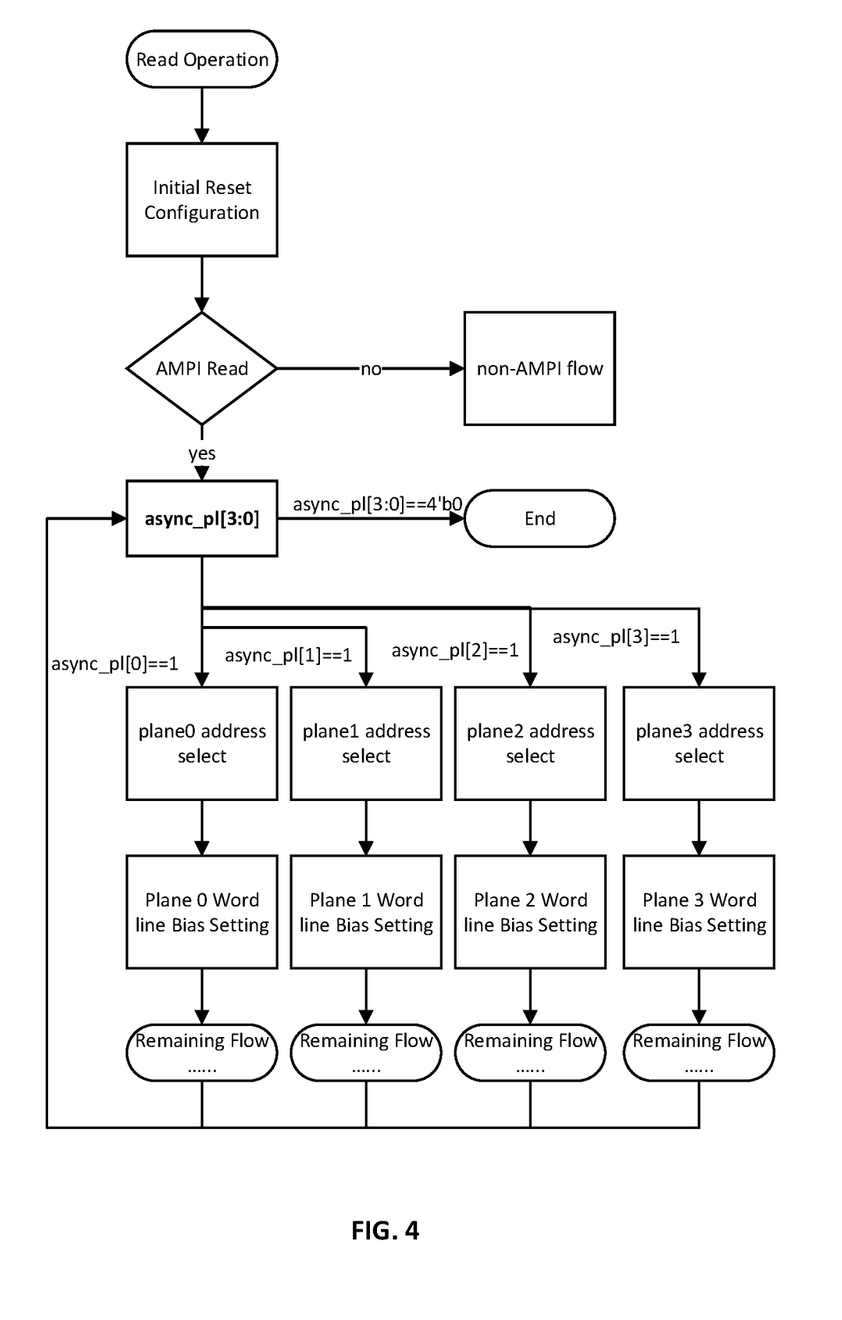
FIG. 4 illustrates a read operation process flow consistent with the disclosed embodiments of the present disclosure.

At the same time, the signal generation circuit 304 may generate a 4-bit asynchronous plane signal async_pl[3:0], each bit corresponds to a memory plane. The async_pl[3:0] is referred as an indicator signal for the MP MCU to determine which memory plane to process. That is, the async_pl[3:0] is used to process the commands in the sequence in which the commands come from the host, such that the host receive data in the same sequence in which the commands are sent to the controller 112. FIG. 4 illustrates a read operation process flow consistent with the disclosed embodiments of the present disclosure.

As shown in FIG. 4, after detecting a read operation, the MP MCU may perform initial reset configuration. For example, the MP MCU may reset all the shift registers and/or other circuitry or page configurations. Further, the MP MCU may determine whether an AMPI read operation is to be started. When it is determined that an AMPI read operation is not used, such as the commands received are not for the multiple memory planes, the MP MCU may start non-AMPI operation flow, which is for normal operation.

On the other hand, when it is determined that an AMPI read operation is used, for example, when the commands are for separate memory planes, the MP MCU checks the indicator signal async_pl[3:0]. If the indicator signal async_pl[3:0] is all '0', the MP MCU determines there is nothing to do, and the read operation ends. On the other hand, if the indicator signal async_pl[3:0] is not all '0', the MP MCU checks each bit and perform read operation on a corresponding memory plane.

For example, when the MP MCU checks that async_pl[0]=1, the MP MCU may determine that a read operation is performed for the plane 0. The MP MCU may select address for plane 0, and perform plane 0 word line bias setting for plane 0 read operation. The remaining read operation flow for plane 0 may then be completed. When the MP MCU checks that async_pl[1]=1, the MP MCU may determine that a read operation is performed for the plane 1. The MP MCU may select address for plane 1, and perform plane 1 word line bias setting for plane 1 read operation. The remaining read operation flow for plane 1 may then be completed. When the MP MCU checks that async_pl[2]=1, the MP MCU may determine that a read operation is performed for the plane 2. The MP MCU may select address for plane 2, and perform plane 2 word line bias setting for plane 2 read operation. The remaining read operation flow for plane 2 may then be completed. When the MP MCU checks that async_pl[3]=1, the MP MCU may determine that a read operation is performed for the plane 3. The MP MCU may select address for plane 3, and perform plane 3 word line bias setting for plane 3 read operation. The remaining read operation flow for plane 3 may then be completed.

That is, the MP MCU may perform a loop operation to check the indicator signal async_pl[3:0], each iteration may perform one read operation flow according to any non-zero bit in the indicator signal async_pl[3:0]. The loop operation is continuously performed until the indicator signal async_pl[3:0] becomes all-zero.

Figure 5:
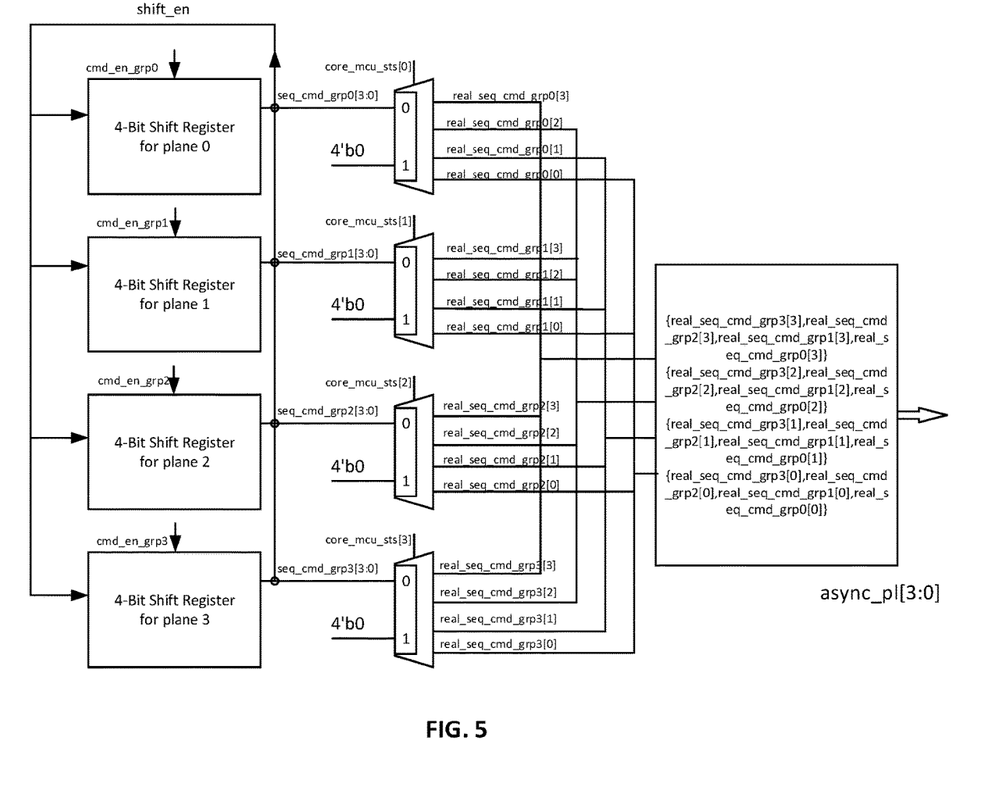
FIG. 5 illustrates an exemplary implementation of the shift registers and the signal generation logic consistent with the disclosed embodiments of the present disclosure.

The indicator signal async_pl[3:0] is generated based on operation of the shift registers corresponding to the memory planes. FIG. 5 illustrates an exemplary implementation of the shift registers and the signal generation logic consistent with the disclosed embodiments of the present disclosure.

As shown in FIG. 5, four shift registers are provided for four memory planes (plane 0, plane 1, plane 2, and plane 3), each register has two input control signals (shift_en, and cmd_en_grp[3:0]) from the MP MCU (not shown) and one output of the 4-bit content of the shift register (i.e., 4-bit output signals). Further, four 4-bit selectors are also provided to connect the outputs of the four shift registers, respectively. Each selector may include two inputs to be selected as the output of the selector, one input is the 4-bit output signal from a corresponding shift register, and the other input is all-zero 4-bit signal. The output signal, real_seq_cmd_grp[3:0], of each selector is controlled by an input control signal core_mcu_sts from the MP MCU, and is selected as either one of the two inputs, i.e., the content of the corresponding shift register seq_cmd_grp[3:0] or 4'b0 (which is '0000'). All outputs from the selectors are evaluated in groups to set up the read operation sequence for the MP MCU.

Figure 6:
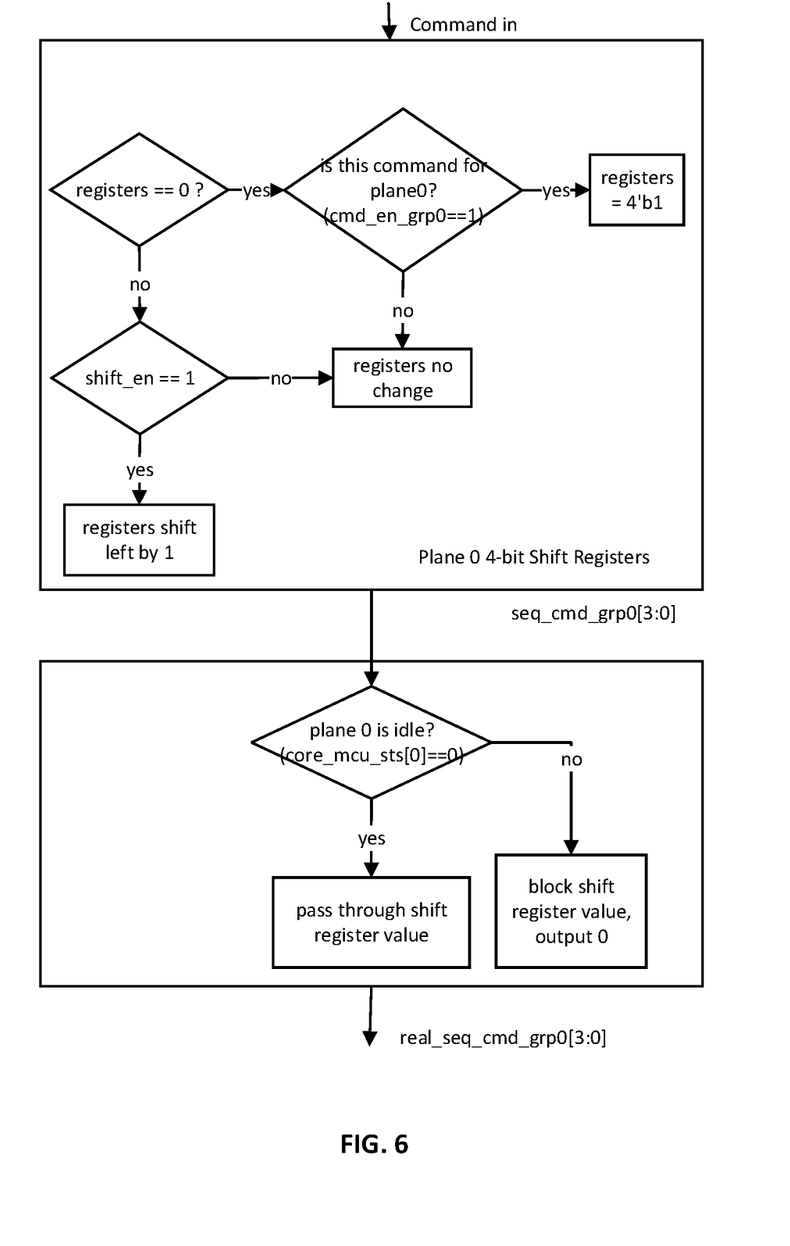
FIG. 6 illustrates a read operation process when receiving a command from the host consistent with the disclosed embodiments of the present disclosure.

More specifically, FIG. 6 illustrates a read operation process when receiving a command from the host consistent with the disclosed embodiments of the present disclosure. This read operation process is performed in the same way for each of the shift registers in parallel, but plane 0 is used for illustrative purposes.

As shown in FIG. 6, for plane 0 (or similarly for any other plane), after receiving an incoming command, it is determined whether the shift register (i.e., shift register seq_cmd_grp0) is 0. If it is determined that the shift register is 0, which indicate that no pending command for the plane corresponding to the shift register, it is further determined whether the command is for this plane, plane 0 (or plane 1, plane 2, plane 3 for other shift registers). The control signal cmd_en_grp0 may be used to determine that the command is for plane 0 if cmd_en_grp0=1, or that the command is not for plane 0 if cmd_en_grp0!=1. If it is determined that the command is for plane 0, the shift register is set to 1 ('0001'). If it is determined that the command is not for plane 0, no change is needed for the shift register.

On the other hand, if it is determined that the register is not 0, it is further determined whether the shift-register enable signal shift_en is set to '1'. If the shift_en is not set to '1', no change is needed for the shift register. If it is determined that the shift_en is set to '1', the shifter register is shift left by 1 bit, that is, the non-zero content of the shift register seq_cmd_grp0 is shift left by one, which means there is a subsequent command coming in while plane 0 is still processing a current command.

At this time, after the completion of the above process, the shift register seq_cmd_grp0 outputs the 4-bit value of the shifter register seq_cmd_grp0[3:0] to the subsequent signal generation circuit to generate the indicator signal for the MP MCU. Specially, the generation circuit determines whether the plane 0 is idle by checking the status signal core_m-cu_sts[0]. If it is determined that the plane 0 is idle (core_m-cu_sts[0]=0), the shift register value (i.e., seq_cmd_grp0[3:0]) is passed through to the next stage of the generation circuit as a 4-bit signal real_seq_cmd_grp0[3:0]. On the other hand, if it is determined that the plane 0 is not idle (core_mcu_sts[0]!=0), the shift register value (i.e., seq_cmd_grp0[3:0]) is blocked, and a 0 value is passed to the next stage of the generation circuit as the 4-bit signal real_seq_cmd_grp0[3:0]. The status signal core_mcu_sts[3:0], corresponding to the memory planes, may be set by the MP MCU based on the internal bus (i.e., MCU NAND_IF) between the controller and the NAND dies. If any core MCU or memory plane takes long time to finish, the status signal core_mcu_sts[3:0] may be used to gate the shift registers so that the shift register does not overflow. Other configurations may also be used.

Figure 7:
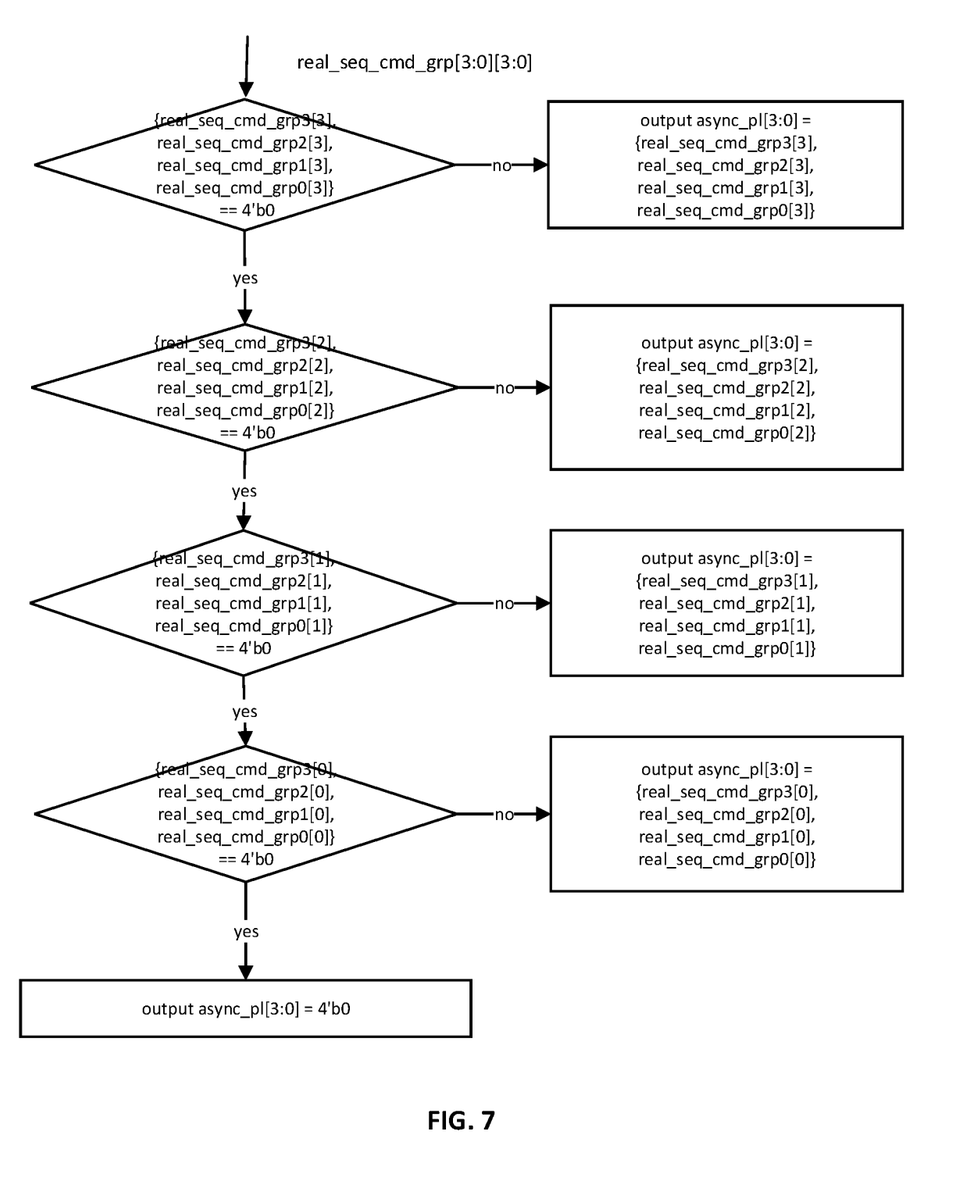
FIG. 7 illustrates a generation process consistent with the disclosed embodiments of the present disclosure.

After all shift registers (seq_cmd_grp0, seq_cmd_grp1, seq_cmd_grp2, seq_cmd_grp3) for all memory planes (plane 0, plane 1, plane 2, plane 3) are processed in parallel, their corresponding 4-bit signal real_seq_cmd_grp0[3:0], 4-bit signal real_seq_cmd_grp1[3:0], 4-bit signal real_seq_cmd_grp2[3:0], and 4-bit signal real_seq_cmd_grp3[3:0] (i.e., the real_seq_cmd_grp[3:0][3:0]) are all outputted to the next stage of the generation circuit to further generate the indicator signal async_pl[3:0] for the MP MCU. FIG. 7 illustrates a generation process consistent with the disclosed embodiments of the present disclosure.

As shown in FIG. 7, after receiving all the outputted 4-bit signals real_seq_cmd_grp[3:0][3:0], one bit from each of the outputs of the shift registers may be combined to form the indicator signal for that bit, starting from the most significant bit (MSB) to the least significant bit (LSB), so as to set the order of the commands based on the receiving order of the commands.

For example, the most significant bit of each of the 4-bit signals (real_seq_cmd_grp0[3], real_seq_cmd_grp0[3], real_seq_cmd_grp0[3], and real_seq_cmd_grp0[3]) are combined with an OR operation. If the result of the OR operation is not zero, the 4-bit indicator signal is set as the most significant bits of the four signals. That is, async_pl[3:0]={real_seq_cmd_grp3[3], real_seq_cmd_grp2[3], real_seq_cmd_grp1[3], real_seq_cmd_grp0[3]}. Further, the indicator signal async_pl[3:0] is outputted to the MP MCU.

On the other hand, if the result of the OR operation with respect to the MSB (bit 3) is zero, the next bit (bit 2) of the 4-bit signals (real_seq_cmd_grp0[2], real_seq_cmd_grp0[2], real_seq_cmd_grp0[2], and real_seq_cmd_grp0[2]) are combined with an OR operation. If the result of the OR operation is not zero, the 4-bit indicator signal is set as the bit 2 of the four signals. That is, async_pl[3:0]={real_seq_cmd_grp3[2], real_seq_cmd_grp2[2], real_seq_cmd_grp1[2], real_seq_cmd_grp0[2]}. Further, the indicator signal async_pl[3:0] is outputted to the MP MCU.

If the result of the OR operation with respect to the bit 2 is zero, the next bit (bit 1) of the 4-bit signals (real_seq_cmd_grp0[1], real_seq_cmd_grp0[1], real_seq_cmd_grp0[1], and real_seq_cmd_grp0[1]) are combined with an OR operation. If the result of the OR operation is not zero, the 4-bit indicator signal is set as the bit 1 of the four signals. That is, async_pl[3:0]={real_seq_cmd_grp3[1], real_seq_cmd_grp2[1], real_seq_cmd_grp1[1], real_seq_cmd_grp0[1]}. Further, the indicator signal async_pl[3:0] is outputted to the MP MCU.

If the result of the OR operation with respect to the bit 1 is zero, the next bit (bit 0) of the 4-bit signals (real_seq_cmd_grp0[0], real_seq_cmd_grp0[0], real_seq_cmd_grp0[0], and real_seq_cmd_grp0[0]) are combined with an OR operation. If the result is not zero, the 4-bit indicator signal is set as the bit 0 of the four signals. That is, async_pl[3:0]={real_seq_cmd_grp3[0], real_seq_cmd_grp2[0], real_seq_cmd_grp1[0], real_seq_cmd_grp0[0]}. Further, the indicator signal async_pl[3:0] is outputted to the MP MCU.

If the result of the OR operation with respect to the bit 0 is zero, because all signals are processed, the async_pl[3:0] is set to 0, and is further outputted to the MP MCU.

Based on the indicator signal async_pl[3:0], the MP MCU completes or controls the completion of the read operation for the incoming commands in the order in which those commands are received, while still utilizing AMPI read operation for high access speed. That is, the AMPI read operation is completed among the memory planes and the results (if any) appear on the host interface using an order of the commands determined based on an indicator signal provided to the MP MCU. The accuracy of the AMPI read operation may be improved, and the added cost for implementing the command sequence may be minimum.

Figure 8:
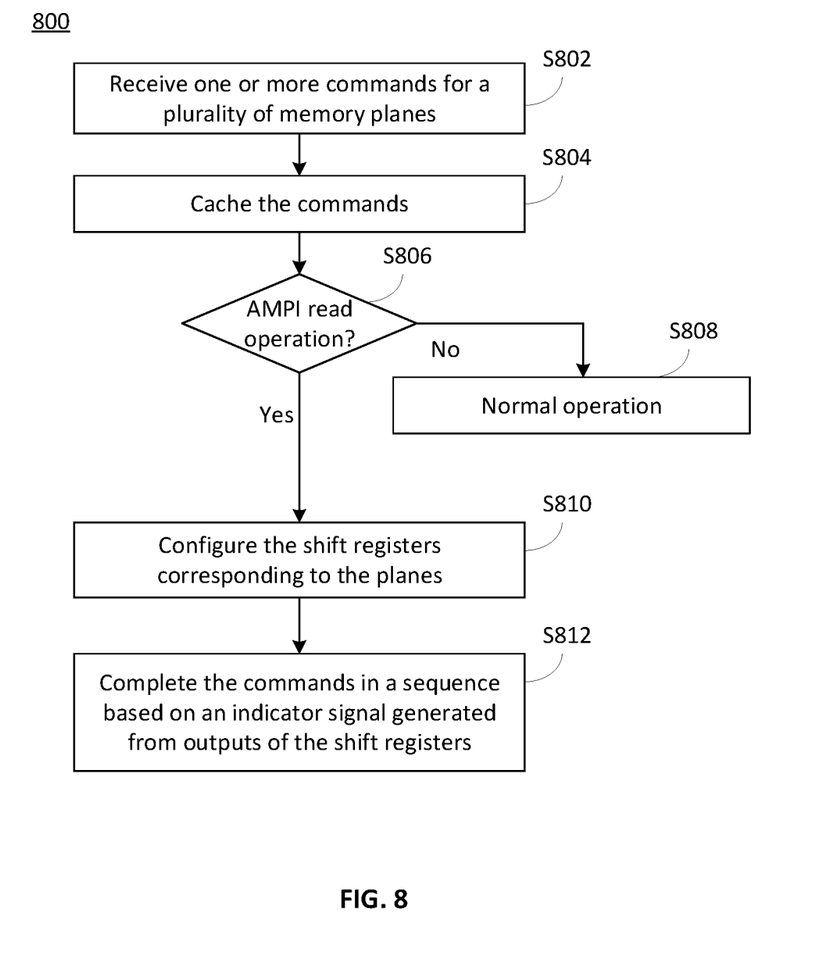
FIG. 8 illustrates an exemplary read operation process performed by the flash chip consistent with the disclosed embodiments of the present disclosure.

FIG. 8 illustrates an exemplary read operation process performed by the flash chip (e.g., the controller of the flash memory chip) consistent with the disclosed embodiments of the present disclosure. As shown in FIG. 8, at the beginning of the process, the controller may receive one or more commands from a host to access the flash memory chip (S802). The commands may be for a plurality of memory planes of the flash memory chip. For example, the commands may be read commands addressed to one or more of the memory planes.

Further, the controller may cache or latch the commands for processing (S804). To improve access speed, the controller may determine whether to start an AMPI read operation to independently access different memory planes in parallel (S806). If the controller determines not to start an AMPI read operation (S806; No), the controller may perform normal operation with respect to the received commands (S808). For example, the commands may be processed one by one in a serial manner.

On the other hand, if the controller determines to start an AMPI read operation (S806; Yes), the controller may configure the shift registers corresponding to the memory planes (S810). As described previously, the shift registers are used to implement a sequence for read operation according to the order in which the commands received by the controller. More specifically, an indicator signal may be generated based on the outputs of the shift registers, and the controller may complete the read operation of the commands in the sequence based on the indicator signal (S812).

Accordingly, a fast and accurate AMPI read operation mechanism may be implemented in the flash memory chip by the disclosed embodiments of the present disclosure. Although shift registers and signal generator circuit are used by the controller to implement the AMPI read operation structure, other components or circuitry may be used to replace or supplement the disclosed implementations, as long as following the principles of the present disclosure.

Although the principles and implementations of the present disclosure are described by using specific embodiments in the specification, the foregoing descriptions of the embodiments are only intended to help understand the present disclosure. In addition, features of aforementioned different embodiments may be combined to form additional embodiments. A person of ordinary skill in the art may make modifications to the specific implementations and application range according to the idea of the present disclosure. Hence, the content of the specification should not be construed as a limitation to the present disclosure.

What is claimed is:

1. A flash memory device, comprising:
   a plurality of memory planes each containing arrays of memory cells;
   a host interface for accessing the plurality of memory planes by an external host; and
   a controller connected to the plurality of memory planes via a memory interface and controlling the host interface for accessing the plurality of memory planes,
   wherein the controller is configured to perform:
      receiving commands on the host interface from the external host;
      determining whether to perform asynchronous multi-plane independent (AMPI) read operation corresponding to the commands; and
      after determining to start the AMPI read operation, processing the commands corresponding to the memory planes in parallel, and presenting results of the AMPI read operation on the host interface using an order of the commands determined based on an indicator signal provided to the controller to correspond to a sequence of the commands received on the host interface; and
   wherein the controller includes:
      a plurality of shift registers, wherein each shift register corresponds to one of the memory planes and has a length of a predetermined number of bits, and a non-zero bit of the shift register selectively indicates whether a command is pending for a corresponding memory plane and/or a non-corresponding memory plane;
      a signal generation circuit coupled to the plurality of shift registers and receiving outputs from the plurality of shift registers to generate the indicator signal; and
      a processing microcontroller configured to receive the indicator signal and to control the shift registers and the signal generation circuit, wherein the indicator signal is a multi-bit asynchronous plane signal, each bit of the indicator signal corresponds to one of the memory planes, and a non-zero bit in the indicator signal indicating the command for a corresponding memory plane is to be completed.

2. The flash memory device according to claim 1, wherein the controller is further configured to perform:
   when determining not to start the AMPI read operation, processing the commands in series as normal operation.

3. The flash memory device according to claim 1, wherein the processing microcontroller determines to start the AMPI read operation when the commands are for separate memory planes.

4. The flash memory device according to claim 1, wherein:
   the shift registers are initially reset to a first data state, when a command is received from the external host, a shift register is set to a second data state when it is determined that the command is for the memory plane corresponding to the shift register, and the shift register is left shift by 1 bit when it is determined that the command is a memory plane not corresponding to the shift register.

5. The flash memory device according to claim 1, wherein:
   the signal generation circuit combines one bit from each of the outputs of the shift registers to form the indicator signal for that bit, starting from the most significant bit (MSB) to the least significant bit (LSB), so as to set the order of the commands.

6. The flash memory device according to claim 5, wherein:
   the signal generation circuit includes a plurality of selectors connected to the outputs of corresponding shift registers, and each selector is individually controlled to output either the output of the corresponding shift register or 0 to form the indicator signal.

7. The flash memory device according to claim 1, wherein:
   the length of the predetermined number of bits of the shift registers indicates a maximum number of pending commands that can be processed for the AMPI read operation.

8. The flash memory device according to claim 7, wherein:
   the length of the predetermined number of bits of the shift registers is 4.

9. The flash memory device according to claim 1, wherein:
   a total number of the memory planes is 4;
   a total number of the shift registers is 4; and
   the indicator signal is a 4-bit signal.

10. The flash memory device according to claim 1, wherein:
the host interface is an open NAND flash interface (ONFI).

11. A method for a flash memory device having a plurality of memory planes each contains arrays of memory cells, a host interface for accessing the plurality of memory planes by an external host, and a controller connected to the plurality of memory planes via a memory interface and controlling the host interface for accessing the plurality of memory planes, the method comprising:
receiving commands on the host interface from the external host;
determining whether to perform asynchronous multi-plane independent (AMPI) read operation corresponding to the commands; and
after determining to start the AMPI read operation, processing the commands corresponding to the plurality of memory planes in parallel, and presenting results of the AMPI read operation on the host interface using an order of the commands determined based on an indicator signal provided to the controller to correspond to a sequence of the commands received on the host interface,
wherein the controller comprises:
a plurality of shift registers, each shift register corresponding to one of the plurality of memory planes, a signal generation circuit coupled to the plurality of shift registers, and a processing microcontroller configured to control the plurality of shift registers and the signal generation circuit, and the method further includes:
using a non-zero bit of the shift register to selectively indicate whether a command is pending for a corresponding memory plane and/or a non-corresponding memory plane;
receiving outputs from the plurality of shift registers to generate the indicator signal, wherein the indicator signal is a multi-bit asynchronous plane signal, and each bit of the indicator signal corresponds to one of the memory planes; and
receiving the indicator signal and using a non-zero bit in the indicator signal to indicate the command for a corresponding memory plane is to be completed.

12. The method according to claim 11, further comprising:
when determining not to start the AMPI read operation, processing the commands in series as normal operation.

13. The method according to claim 11, further comprising:
when the commands are for separate memory planes, determining to start the AMPI read operation.

14. The method according to claim 11, further comprising:
initially setting a shift register of the plurality of shift registers to a first data state, and
after a command is received from the external host, setting the shift register to a second data state when it is determined that the command is for the memory plane corresponding to the shift register, and left shifting the shift register by 1 bit when it is determined that the command is a memory plane not corresponding to the shift register.

15. The method according to claim 14, further comprising:
combining, by the signal generation circuit, one bit from each of the outputs of the shift registers to form the indicator signal for that bit, starting from the most significant bit (MSB) to the least significant bit (LSB), so as to set the order of the commands,
wherein the signal generation circuit includes a plurality of selectors connected to the outputs of corresponding shift registers, and each selector is individually controlled to output either the output of the corresponding shift register or 0 to form the indicator signal.

16. The method according to claim 11, wherein a length of a predetermined number of bits of the shift registers indicates a maximum number of pending commands to be processed for the AMPI read operation.

17. The method according to claim 16, wherein the length of the predetermined number of bits of the shift registers is 4.

18. The method according to claim 11, wherein:
a total number of the memory planes is 4;
a total number of the shift registers is 4;
the indicator signal is a 4-bit signal; and
the host interface is an open NAND flash interface (ONFI).

* * * * *